(12) United States Patent
Lin et al.

(10) Patent No.: US 10,120,737 B2
(45) Date of Patent: Nov. 6, 2018

(54) APPARATUS FOR DETECTING BUGS IN LOGIC-BASED PROCESSING DEVICES

(71) Applicant: The Board of Trustees of the Leland Stanford Junior University, Stanford, CA (US)

(72) Inventors: Hai Lin, Stanford, CA (US); Subhasish Mitra, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 143 days.

(21) Appl. No.: 15/047,376

(22) Filed: Feb. 18, 2016

(65) Prior Publication Data

US 2016/0245865 A1  Aug. 25, 2016

Related U.S. Application Data

(60) Provisional application No. 62/118,280, filed on Feb. 19, 2015.

(51) Int. Cl.
 *G06F 11/00* (2006.01)
 *G01R 31/317* (2006.01)

(52) U.S. Cl.
 CPC ........ *G06F 11/00* (2013.01); *G01R 31/31705* (2013.01)

(58) Field of Classification Search
 CPC .......................... G06F 11/00; G01R 31/31705
 See application file for complete search history.

(56) References Cited

PUBLICATIONS

Lin, D., et al., "Quick Detection of Difficult Bugs for Effective Post-Silicon Validation," Proc. IEEE/ACM Design Automation Conf., pp. 561-566, 2012.*

* cited by examiner

*Primary Examiner* — April Y Blair
*Assistant Examiner* — Rong Tang
(74) *Attorney, Agent, or Firm* — Anthony P. Ng; Russell Ng PLLC

(57) ABSTRACT

An apparatus for detecting bugs in a logic-based processing device during post-silicon validation is disclosed. The apparatus includes a test bench and a Proactive Load and Check (PLC) hardware checker inserted within an uncore component of the logic-based processing device. The test bench includes a processor for converting an original test program to a modified test program for validating the functionalities of the logic-based processing device during post-silicon validation. The PLC hardware checker includes a controller, an address generator, a data register and a comparator.

6 Claims, 5 Drawing Sheets

```
INITIALIZATION:                  INITIALIZATION:
r0 = 0                           r0 = 0
r1 = 1                           r16 = 0
r2 = 3                           r1 = 1
 . . .                           r17 = 1
r15 = 7                          r2 = 3
BODY:                            r18 = 3
r1 = r0 - r1                      . . .
r15 = r2 * r2                    r15 = 7
     .                           r31 = 7
     .                           BODY:
     .                           r1 = r0 - r1
                                 r15 = r2 * r2
                                 r17 = r16 - r17
                                 r31 = r18 * r18
                                 CHECK (r1==r17)
                                 CHECK (r15==r31)

ORIGINAL                         MODIFIED
TEST PROGRAM                     TEST PROGRAM
```

FIG. 5

APPARATUS FOR DETECTING BUGS IN LOGIC-BASED PROCESSING DEVICES

PRIORITY CLAIM

The present application claims priority under 35 U.S.C. § 119(e)(1) to provisional application No. 62/118,280, tiled on Feb. 19, 2015, the contents of which are incorporated herein by reference.

RELATED APPLICATION

The present application is related to U.S. application Ser. No. 14/318,976, filed on Jun. 30, 2014, the contents of which are incorporated herein by reference.

BACKGROUND OF THE INVENTION

1. Technical Field

The present invention relates to logic-based processing device testings in general, and in particular to an apparatus for detecting bugs in logic-based processing devices.

2. Description of Related Art The manufacturing process of logic-based processing devices typically includes several stages such as design, verification, validation and production stages. Initially, the logic circuit of a logic-based processing device is designed by using various software design tools. Before any physical devices are made, the functionalities of the logic circuit design are verified (i.e., pre-silicon verification) to allow circuit designers to locate and fix any bugs in the logic circuit design. If the logic circuit design passes the pre-silicon verification, a limited number of physical prototype devices are made, and tests are then performed on the physical prototype devices post-silicon validation) to detect any bugs attributable not only to the architecture of the logic circuit design, but also due to process variations, manufacturing defects, and environmental variations. After all the detected bugs have been fixed, the logic-based processing device can then be sent to large-scale production.

During pre-silicon verification, a virtualized logic-based processing device is loaded into a verification system such as a simulator or emulator. After providing input data to the virtualized logic-based processing device, the verification system then performs a battery of tests on the behavior of the virtualized logic-based processing device. If the behavior of the virtualized logic-based processing device differs from what is expected from the given input data, it means there is a bug in the logic circuit design.

Post-silicon validation is similar to pre-silicon verification, but occurs on the physical prototype devices. Post-silicon validation is essentially the real world counterpart of the pre-silicon verification. Conventional approaches to post-silicon validation suffer from the same error detection latency problems as those in pre-silicon verification; that is, it may take several billion clock cycles between the occurrence of an error and the detection thereof.

Consequently, it would be desirable to provide an improved apparatus for performing post-silicon validation with a shorter error detection latency.

SUMMARY OF THE INVENTION

In accordance with a preferred embodiment of the present invention, an apparatus for detecting bugs in a logic-based processing device includes a test bench and a Proactive Load and Check (PLC) hardware checker inserted within an uncore component of the logic-based processing device. The test bench includes a processor for converting an original test program to a modified test program for validating the functionalities of the logic-based processing device during post-silicon validation. The PLC hardware checker includes a controller, an address generator, a data register and a comparator.

The controller can initiate a PLC operation when certain criteria are met. The address generator then generates an address of an original variable in the uncore component with which the PLC hardware checker is associated. The value of the original variable address is subsequently stored in the data register. The comparator then compares the value stored within the data register to a value at a corresponding shadow variable address within the modified test program. When the value stored within the data register does not match the value at the corresponding shadow variable address within the modified test program, the test bench indicates an existence of a bug within the logic-based processing device to be tested.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 5 illustrates an example of an original test program along with its corresponding modified test program.

DETAILED DESCRIPTION OF A PREFERRED EMBODIMENT

Figure 1:
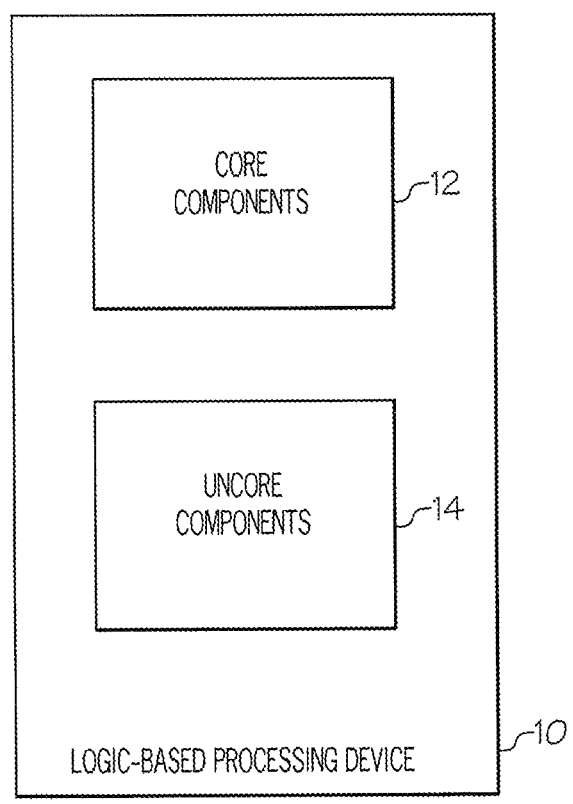
FIG. 1 is a block diagram of a logic-based processing device in which a preferred embodiment of the present invention is applicable.

Referring now to the drawings and in particular to FIG. 1, there is illustrated a block diagram of a logic-based processing device in which a preferred embodiment of the present invention is applicable. As shown, a logic-based processing device 10 includes core components 12 and uncore components 14. Core components 12 include various processors of logic-based processing device 10, and uncore components 14 include all other elements of logic-based processing device 10, such as cache memories, memory controllers, input/output (I/O) controllers, etc. Uncore components are sometimes referred to as north bridge or nest components by those skilled in the art.

Uncore components 14 within logic-based processing device 10 can be broadly classified into the following three categories:

(a) uncore components that are part of a cache memory subsystem (e.g., cache memories and cache controllers);

(b) uncore components that use cache memories to communicate with processor cores via load/store instructions (e.g., memory controllers, network controllers, PCI Express interface, etc.); and (c) uncore components that use special instructions such as I/O instructions (but do not use cache memories) to communicate with processor cores (e.g., programmable I/O modules, interrupt-processing units, etc.).

Figure 2:
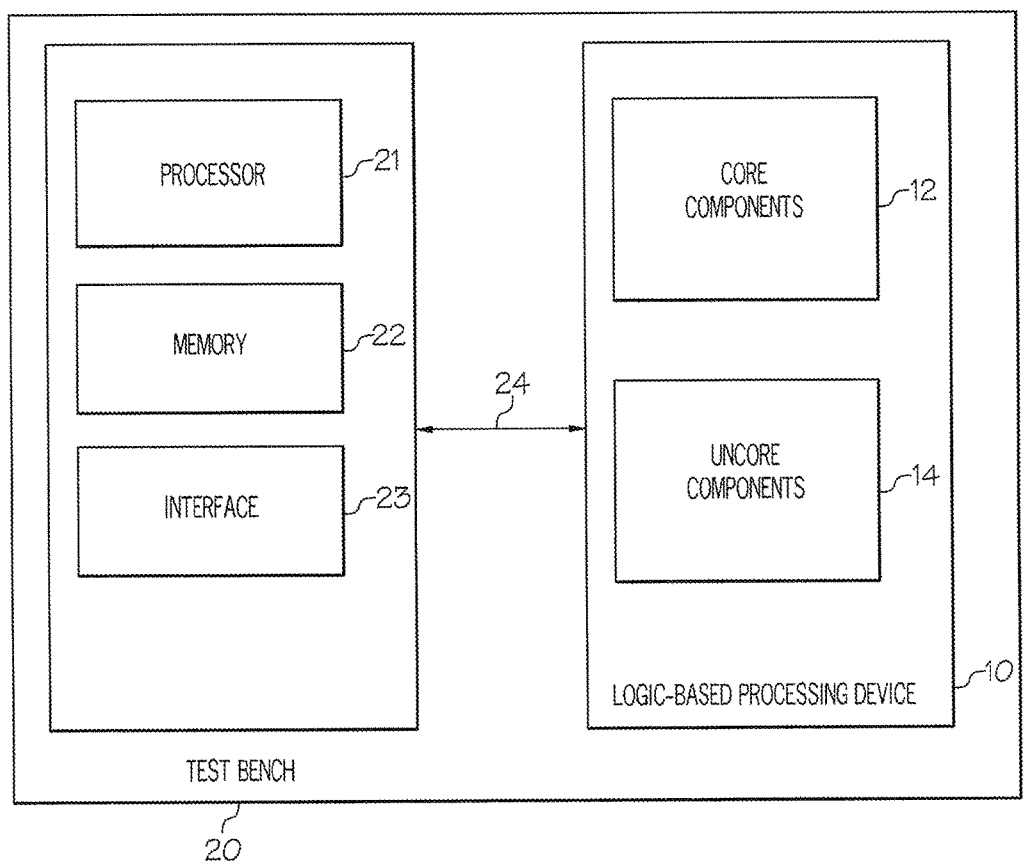
FIG. 2 is a block diagram of a test bench for performing post-silicon validations, in accordance with a preferred embodiment of the present invention.

With reference now to FIG. 2, there is depicted a block diagram of a test bench for performing post-silicon validations, in accordance with a preferred embodiment of the present invention. As shown, a test bench 20 includes a processor 21, a memory device 22 and an interface 23. Memory device 22 stores a set of test instructions that enable test bench 20 to systematically validate the functionalities of logic-based processing device 10. Interface 23 allows processor 21 to transfer the test instructions via a bus 24 to logic-based processing device 10 where the test instructions can be executed for the purpose of performing post-silicon validation.

In accordance with a preferred embodiment of the present invention, test bench 20 along with a Proactive Load and Check (PLC) hardware checker are utilized to perform PLC operations in order to quickly detect any bugs located inside uncore components 14 of logic-based processing device 10. Specifically, test bench 20 along with the PLC hardware checker target bugs inside the above-mentioned categories (a) and (b) of uncore components 14 by performing PLC operations on cache memories. On the other hand, bugs inside the above-mentioned category (c) of uncore components 14, as well as inside processor cores, can be quickly detected by using test bench 20 alone.

Figure 3:
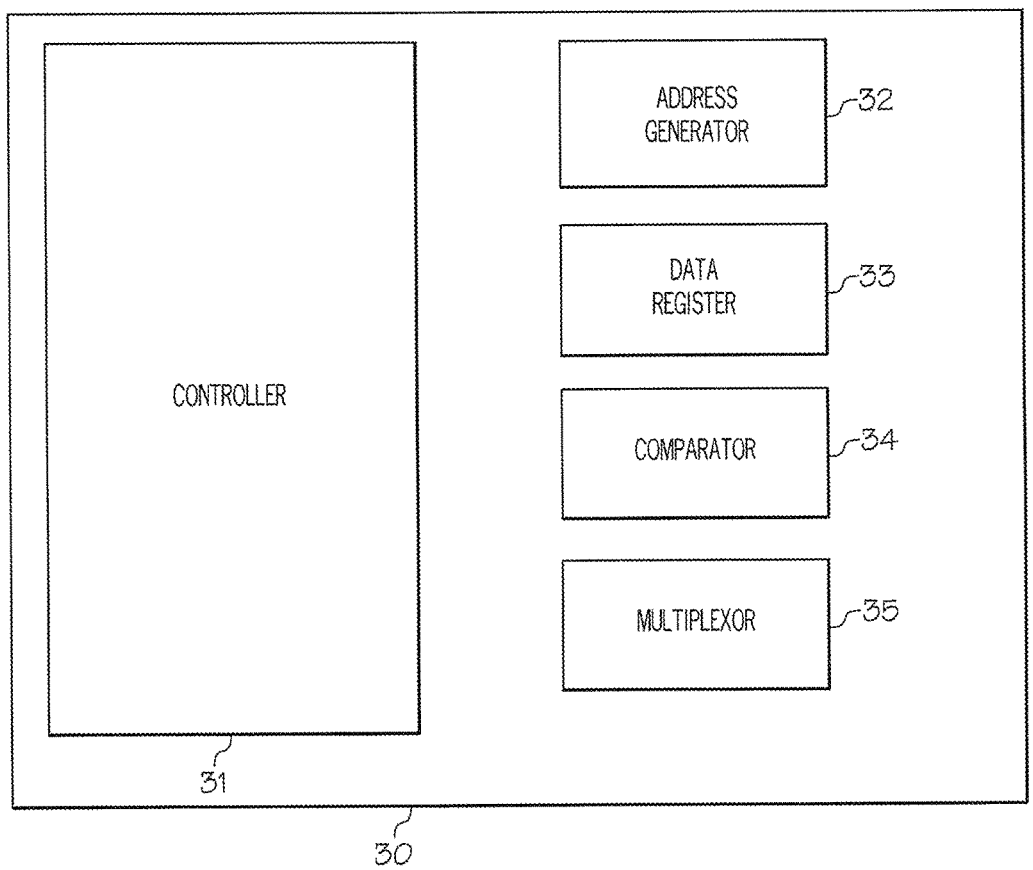
FIG. 3 is a block diagram of a Proactive Load and Check (PLC) hardware checker, in accordance with a preferred embodiment of the present invention.

Referring now to FIG. 3, there is illustrated a block diagram of a PLC hardware checker, in accordance with a preferred embodiment of the present invention. As shown, a PLC hardware checker 30 includes a controller 31, an address generator 32, a data register 33, a comparator 34, and a multiplexor 35. Controller 31 determines if and when a PLC operation can be performed, and controls the other components within PLC hardware checker 30 during a PLC operation.

When instructed by controller 31, address generator 32 generates the address of an original variable. The address ranges corresponding to the original variables may be programmed into address generator 32 via a debugger. If each cache memory array has its own separate PLC hardware checker, address generator 32 of each PLC hardware checker only needs to generate addresses of original variables that are cached in a corresponding cache memory array. As an example, for a processor having an address range of 0x0000-0x7FFF being cached by a cache memory array 0 of a bank 0 of an L2 cache, if the address range of the original variables spans between 0x6000-0x6FFF and 0x8000-0x8FFF, then address generator 32 for that cache memory array only needs to generate addresses 0x6000-0x6FFF.

When instructed by controller 31, data register 33 holds the value loaded from a cache memory array. Comparator 34 compares the data value held in data register 33 with a data value loaded from the cache memory array. Any mismatch between the data value held in data register 33 and the data value loaded from the cache memory array indicates an error, and an error signal is then mapped to an on-chip debug circuit such as JTAG.

When a memory built-in-self-test (MBIST) engine is included within a logic-based processing device, multiplexor 35 is utilized to select among a normal mode, a MBIST mode, and a PLC check mode. PLC operations are performed by PLC hardware checker 30 only when the PLC check mode has been selected. No PLC operation will be performed by PLC hardware checker 30 during the normal and MBIST modes. During the MBIST mode, PLC hardware checker 30 allows the MBIST engine to test the cache memory array, but the MBIST mode is not needed if PLC hardware checker 30 does not use any components of the MBIST engine (i.e., not sharing any components with the MBIST engine).

Figure 4:
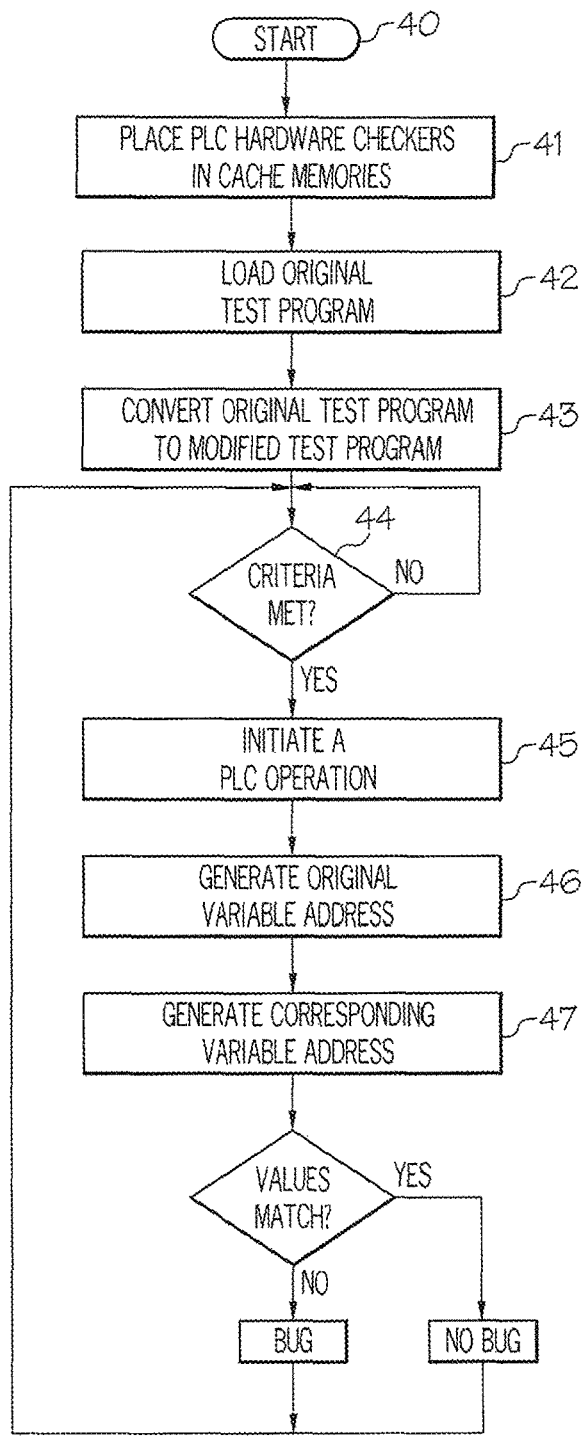
FIG. 4 is a process flow diagram of a method for detecting bugs in a logic-based processing device during post-silicon validation, in accordance with a preferred embodiment of the present invention.

With reference now to FIG. 4, there is depicted a process flow diagram of a method for detecting bugs in a logic-based processing device during post-silicon validation, in accordance with a preferred embodiment of the present invention. Starting at block 40, a set of PLC hardware checkers, such as PLC hardware checker 30 from FIG. 3, is placed within all cache memories of a logic-based processing device, such as logic-based processing device 10 from FIG. 1, during the design stage of the logic-based processing device, as shown in block 41. Preferably, PLC hardware checkers are not placed in other on-chip memories such as register files, translation lookaside buffers, and first-in-first-out buffers. PLC hardware checkers are also not placed in external random access memories.

Technically speaking, only one single PLC hardware checker is needed to initiate and perform PLC operations on the entire logic-based processing device, but it will take an extremely long time because the one single PLC hardware checker must perform PLC operations on all cache memories within the logic-based processing device. Thus, it is more preferable to employ multiple PLC hardware checkers within the logic-based processing device, such as placing one PLC hardware checker per cache memory within the logic-based processing device. Multiple PLC hardware checkers can speed up PLC operations significantly, especially when multiple PLC hardware checkers are able to perform PLC operations concurrently.

During the design stage of the logic-based processing device, circuit designers and/or test engineers have typically formulated an original test program for the purpose of validating the functionalities of the logic-based processing device. During post-silicon validation, this original test program is loaded into a test bench, such as test bench 20 from FIG. 2, at which the logic-based processing device is placed to be tested, as depicted in block 42.

The original test program is then converted into a modified test program by the test bench, as shown in block 43. The modified test program allows the post-silicon validation process to be performed more quickly. Preferably, the original test program can be converted into the modified test program as follows:

i. The contents of the original variables in the original test program are copied into a set of corresponding shadow variables;

ii. Instructions of the original test program are divided into multiple blocks of instructions, and each block of instructions is duplicated by substituting the original variables with the shadow variables. In other words, for each instruction (such as load or store) in each block of the original test program operating on original variables, a corresponding shadow instruction is generated to operate on the corresponding shadow variables;

iii. A set of validation instructions is added after each block of instructions to compare the contents of the original variables to the contents of the corresponding shadow variables. Suffice to say, the contents of the original variables should be the same as the contents of the corresponding shadow variables after the completion of the block of instructions from the original test program and the corresponding block of shadow instructions. If not, it means a bug exists in the hardware.

During the execution of the modified test program by the logic-based processing device being tested, registers within the logic-based processing device that are not used by the original variables can be used to store shadow variables. If there is not enough unused registers within the logic-based processing device to be served as shadow registers for storing shadow variables, some or all of the original variable contents can be copied into a set of memory locations in an external memory such as memory device 22.

FIG. 5 illustrates an example of an original test program along with its corresponding modified test program. In the original test program, a total of 16 variables r0-r15, which are respectively stored in registers R0-R15 within the logic-based processing device being tested, are declared in the INITIALIZATION section, and these 16 variables r0-r15 are copied into a set of corresponding shadow variables r16-r31 to be stored in respective shadows registers R16-R31 within the logic-based processing device being tested. Next, instructions in the BODY section of the original test program are divided into multiple blocks of instructions (showing two instructions in the example block of the original test program), and the block of instructions r1=r0−r1 and r15=r2*r2 are duplicated by substituting the original variables in the instructions with the shadow variables to become r17=r16−r17 and r31=r18*r18, respectively. Finally, two validation instructions CHECK (r1==r17) and CHECK (r15==r31) are added after the above-mentioned block of two instructions to compare the contents of original variables r1 and r15 to the contents of the corresponding shadow variables r17 and 31, respectively.

Before initiating a PLC operation, a controller (such as controller 31 from FIG. 3) within the PLC hardware checker needs to ensure all of the following criteria are satisfied:

Criterion 1: A cache memory array to be checked does not have a load/store operation in progress. This can be accomplished by monitoring a cache array enable signal from processor cores or uncore components.

Criterion 2: No excessive PLC operations (such as no more than five PLC operations) that will cause a bug to become undetectable. This can be satisfied by tracking the number of ongoing load/store operations.

Criterion 3: A PLC operation must not be started between a store operation to an original register (for storing an original variable) and a corresponding store operation to a corresponding shadow register (for storing a corresponding shadow variable) in order to avoid any false fails. In order to satisfy this criterion 3, controller 31 utilizes the fact that the shadow store instruction is always located immediately after the original store instruction in the modified test program. Thus, controller 31 counts the number of store operations to original and shadow registers, and initiates a PLC operation only when the two numbers match.

The counting number approach to satisfy Criterion 3 is effective for strong memory ordering architecture, which ensures that store operations are never reordered. Architectures with weak memory ordering can reorder store operations. For architectures with weak memory ordering, a memory barrier instruction can be inserted (in software) after every shadow store instruction to ensure that those store instructions are not reordered. While memory barrier instructions can introduce a small degree of intrusiveness, the intrusiveness level can be systematically adjusted and controlled by using a transformation parameter Inst_min for the modified test program, where Inst_min is defined as the minimum number of instructions from the original test program that must execute before any instructions (including memory barrier instructions) inserted by an error detection transformation can execute. A high number of Inst_min means that memory barrier instructions are inserted infrequently and longer sequences of memory instructions may execute in the original reordered state.

Referring now back to FIG. 4, after the controller within the PLC hardware checker has determined that the above-mentioned three criteria are met, as depicted in block 44, the controller can then initiate a single PLC operation, as shown in block 45. During a PLC operation, a cache memory being tested does not respond to normal load/store operations from any processor cores, and all load/store operations from any processor cores will be held at input buffers of corresponding cache memories. If the input buffers of the corresponding cache memories are completely full, then further load/store operations from any processor cores will be stalled.

Next, the controller instructs an address generator (such as address generator 32 in FIG. 3) to generate the address of an original variable (e.g., r1) used in the modified test program, as depicted in block 44. This address can then be looked up in the tag entry of the cache memory within the logic-based processing device to be tested in order to determine its location in a cache memory array (e.g., the $1^{st}$ entry in an L1 cache memory array) of the logic-based processing device to be tested. If the address does not exist in the tag entry (i.e., a cache miss), then the address is not loaded, and the PLC operation is not performed on this original variable. If the address exists in the tag entry (i.e., a cache hit), then the value at the address is loaded from the cache memory location into a data register (such as data register 33 in FIG. 3).

Next, the controller instructs the address generator to generate the address of a corresponding shadow variable, as shown in block 47. Similarly, this address can then be looked up in the tag entry of the cache memory within the logic-based processing device to be tested in order to determine its location in a cache memory array (e.g., the $256^{th}$ entry in the L1 cache memory array) of the logic-based processing device to be tested. If this address exists in the tag entry (i.e., a cache hit), the value of the address is loaded from the cache memory location and compared by a comparator (such as comparator 34 from FIG. 3) to the original variable value stored in the data register, as depicted in block 48. If the loaded value does not match the original variable value stored in the data register, it means that there is a bug, as shown in block 49. If the address does not exist, the PLC operation is not performed on this variable. This completes a single PLC operation, and the controller can assert a normal signal to allow the cache memory to respond to normal load/store operations from any processor cores. The process returns back to block 44 to be ready for another PLC operation.

As has been described, the present invention provides an improved apparatus for detecting bugs in a logic-based processing device during post-silicon validation.

While the invention has been particularly shown and described with reference to a preferred embodiment, it will be understood by those skilled in the art that various changes in form and detail may be made therein without departing from the spirit and scope of the invention.

What is claimed is:

1. An apparatus for detecting bugs in a logic-based processing device during post-silicon validation, said apparatus comprising:
 a test bench having a processor for converting an original test program to a modified test program by dividing instructions of said original test program into multiple blocks of instructions, and by substituting an original register in one of said blocks of instructions with a shadow register, and for executing said modified test program; and
 a plurality of Proactive Load and Check (PLC) hardware checkers, each inserted within an uncore component of said logic-based processing device to be tested, wherein said PLC hardware checkers perform PLC operations concurrently, wherein one of said PLC hardware checkers includes:
  a controller for initiating a PLC operation in response to a determination that a predetermined set of criteria has been met;
  an address generator for generating an address of an original variable in said uncore component with which said PLC hardware checker is associate;
  a data register for storing a value at said original variable address: and
  a comparator for comparing said value stored within said data register to a value at a corresponding variable address within said modified test program, and for indicating an existence of a bug within said logic-based processing device to be tested when said value stored within said data register does not match said value from said corresponding variable address within said modified test program.

2. The apparatus of claim 1, wherein said predetermined set of criteria includes no load/store operation in progress in a cache memory.

3. The apparatus of claim 2, wherein said predetermined set of criteria includes less than a predetermined number of PLC operation in progress.

4. The apparatus of claim 3, wherein said predetermined set of criteria includes no PLC operation between a store operation to an original register and a corresponding store operation to said one shadow register within said modified test program.

5. The apparatus of claim 1, wherein said processor adds a plurality of shadow instructions to said original test program in order to convert said original test program to said modified test program.

6. The apparatus of claim 1, wherein said encore component is a cache memory.

* * * * *